(12) United States Patent
Min et al.

(10) Patent No.: US 9,992,865 B2
(45) Date of Patent: Jun. 5, 2018

(54) CIRCUIT BOARD AND ASSEMBLY THEREOF

(71) Applicant: SAMSUNG ELECTRO-MECHANICS CO., LTD., Suwon-si (KR)

(72) Inventors: Tae-Hong Min, Hwaseong-si (KR); Myung-Sam Kang, Hwaseong-si (KR); Young-Gwan Ko, Seoul (KR); Min-Jae Seong, Mungyeong-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 172 days.

(21) Appl. No.: 15/045,544

(22) Filed: Feb. 17, 2016

(65) Prior Publication Data

US 2016/0249457 A1 Aug. 25, 2016

(30) Foreign Application Priority Data

Feb. 24, 2015 (KR) ........................ 10-2015-0025778

(51) Int. Cl.
  *H05K 7/00* (2006.01)
  *H05K 1/02* (2006.01)
  *H01L 23/13* (2006.01)
  *H01L 23/498* (2006.01)
  *H01L 23/00* (2006.01)
  *H05K 1/11* (2006.01)
  *H05K 3/46* (2006.01)

(52) U.S. Cl.
  CPC ........... *H05K 1/0298* (2013.01); *H01L 23/13* (2013.01); *H01L 23/49822* (2013.01); *H01L 23/49827* (2013.01); *H01L 24/00* (2013.01); *H05K 1/113* (2013.01); *H05K 3/4608* (2013.01); *H05K 2201/0195* (2013.01); *H05K 2201/0367* (2013.01); *H05K 2201/09672* (2013.01); *H05K 2201/09872* (2013.01); *H05K 2201/10674* (2013.01)

(58) Field of Classification Search
  CPC ........ H05K 3/285; H05K 1/162–1/267; H05K 1/0231; H05K 1/0306; H01L 23/50; H01L 2924/01078–2924/01079
  USPC .......................... 174/258–264; 361/760–795
  See application file for complete search history.

(56) References Cited

U.S. PATENT DOCUMENTS

| | | | | |
|---|---|---|---|---|
| 6,514,853 B1 * | 2/2003 | Matsubara | ......... | H01L 21/7684 257/E21.583 |
| 7,525,814 B2 * | 4/2009 | Yuri | .................... | H01L 21/4857 361/306.3 |
| 7,916,492 B1 * | 3/2011 | Zhong | .................... | H05K 3/285 174/255 |
| 8,164,920 B2 * | 4/2012 | Kariya | .................... | H01L 23/50 361/764 |

* cited by examiner

*Primary Examiner* — Tuan T Dinh
(74) *Attorney, Agent, or Firm* — NSIP Law

(57) ABSTRACT

A circuit board and an assembly including the circuit board are provided. The circuit board includes a first insulation layer, a first conductive pattern disposed on the first insulation layer, an insulation film disposed on the first conductive pattern, and a second conductive pattern disposed on the insulation film. The insulation film includes an insulation thin film contacting the first conductive pattern, and a function film disposed on the insulation thin film and contacting the second conductive pattern.

7 Claims, 2 Drawing Sheets

CIRCUIT BOARD AND ASSEMBLY THEREOF

CROSS-REFERENCE TO RELATED APPLICATIONS

This application claims the benefit under 35 USC 119(a) of Korean Patent Application No. 10-2015-0025778, filed Office on Feb. 24, 2015, in the Korean Intellectual Property Office, the entire disclosure of which is incorporated herein by reference for all purposes.

BACKGROUND

1. Field

The following description relates to a circuit board and a circuit board assembly.

2. Description of Related Art

In accordance with a trend toward the production of lighter, smaller, faster multi-functional electronic devices with improved performance, multilayered substrate technologies in which a plurality of wiring layers are formed on a printed circuit board (PCB) have been developed. Further, technologies in which electronic components such as active elements, passive elements, or the like, are embedded in a multilayered substrate have also been developed.

However, as an application processor (AP) that is connected to the multilayered substrate becomes multi-functional and high-performance, the amount of heat generated by the electronic components also increases.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a circuit board includes a first insulation layer, a first conductive pattern disposed on the first insulation layer, an insulation film disposed on the first conductive pattern, and a second conductive pattern disposed on the insulation film, and the insulation film includes an insulation thin film contacting the first conductive pattern, and a function film disposed on the insulation thin film and contacting the second conductive pattern.

The insulation thin film may include parylene.

The function film may include titanium nitride (TiN).

At least a portion of the insulation film that is interposed between the first conductive pattern and the second conductive pattern may be opened to connect electrically the first conductive pattern and the second conductive pattern.

The first insulation layer may be formed by disposing the insulation film on a surface of a core part comprising a metallic material.

The general aspect of the circuit board may further include a through via penetrating through the first insulation layer, and a first lower conductive pattern, one surface of the first lower conductive pattern being in contact with a lower surface of the through via, and an upper surface of the through via may be in contact with at least a portion of the first conductive pattern.

A recess may be formed in the core part.

In another general aspect, a circuit board assembly includes an additional board comprising a first external connection member and a second external connection member that are exposed through one surface; a first electronic component embedded in the additional board to contact the first external connection member with an external contact; and a circuit board disposed on an upper portion of the first electronic component and the additional board, the circuit board being electrically connected to the second external connection member and being in contact with the first electronic component. The circuit boards may include a core part having a recess in which at least a portion of the first electronic component is inserted; a first lower conductive pattern, one surface of the first lower conductive pattern being in contact with a lower surface of the through via, and other surface of the first lower conductive pattern being connected to the second external connection member; a first insulation film, one surface of the first insulation film being in contact with an upper surface of the core part; a first conductive pattern, one surface of the first conductive pattern being in contacted with the other surface of the first insulation film; a second insulation film, one surface of the second insulation film being in contacted with the other surface of the first conductive pattern; and a second conductive pattern, one surface of the second conductive pattern being in contact with the other surface of the second insulation film. The second insulation film may include an insulation thin film contacting the first conductive pattern and a function film disposed on the insulation thin firm and contacting the second conductive pattern.

The insulation thin film may include parylene, and the function film may include titanium nitride (TiN).

The core part may include a metallic material, and the first insulation film may include a parylene film, one surface of the parylene film being in contacted with the core part, and a titanium nitride film, one surface of the titanium nitride film being in contact with the parylene film, and other surface of the titanium nitride film being in contact with one surface of the first conductive pattern.

At least one among outer surfaces of the first electronic component may directly contact the metallic material of the core part.

At least a portion of the first conductive pattern may be in contact with an upper surface of the through via.

At least a portion of the second conductive pattern may penetrate through the second insulation film to be contacted with the first conductive pattern.

The circuit board may further include a third external connection member electrically contacted with the second conductive pattern, and the circuit board assembly may further include a second electronic component contacted with the third external connection member.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
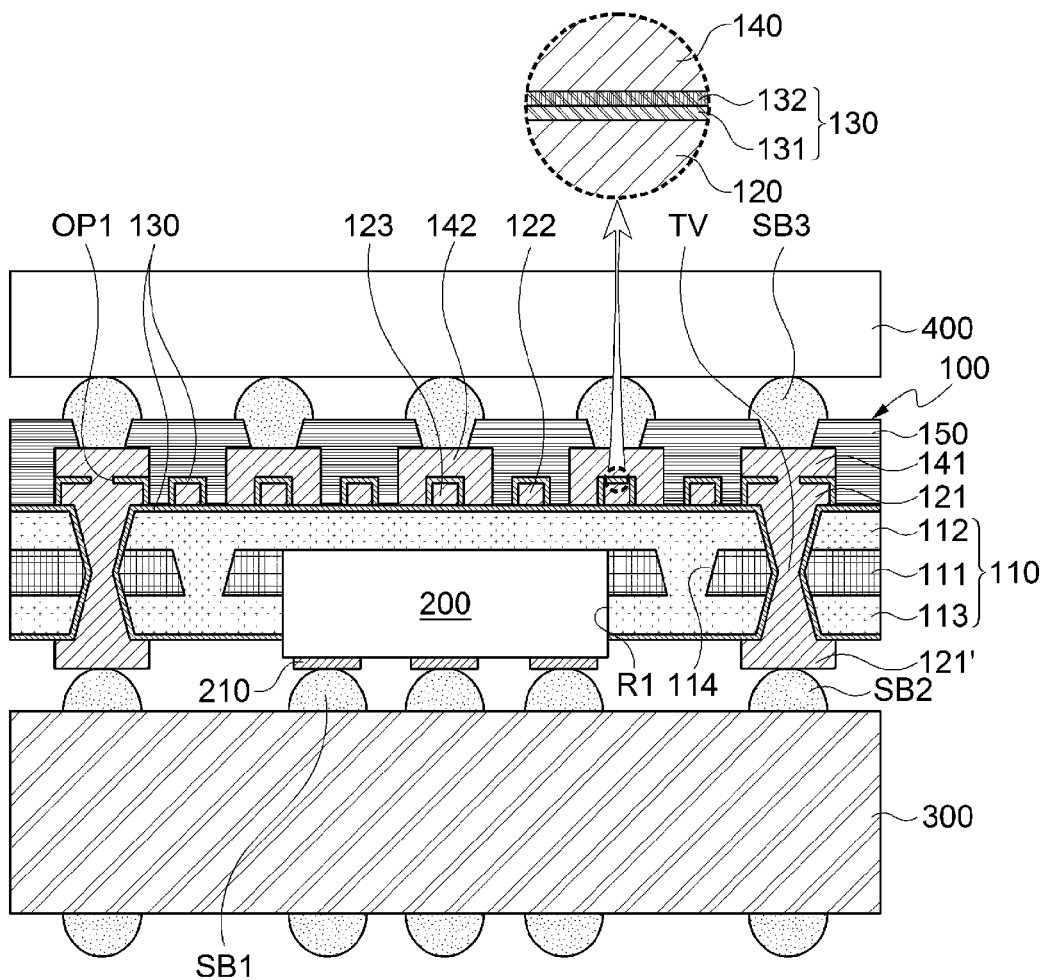
FIG. 1 is a diagram schematically illustrating an example of a circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Terms used herein are provided for explaining embodiments of the present description, not for limiting the description. As used herein, the singular forms "a", "an" and "the" are intended to include the plural forms as well, unless the context clearly indicates otherwise. It will be further understood that the terms "comprises" and/or "comprising," when used in this specification, specify the presence of stated components, motions, and/or devices, but do not preclude the presence or addition of one or more other components, motions, and/or devices thereof.

For the purpose of simplification and clarification of illustration, the drawings show conventional configurations, and known characteristics and detailed description of techniques may be omitted to avoid description of the embodiments from becoming unnecessary unclear. Additionally, components of the drawings are not necessarily drawn according to their scales. For example, sizes of some components of the drawings may be exaggerated for the convenience of understanding of the present description. Like reference numerals in different drawings designate like element, and similar reference numerals may designate similar elements, not necessarily so.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present description. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

It will be understood that when terms "left," "light," "front," "rear," "on," "under," "over," "beneath" or the like are used, the terms are merely used for the purpose of description, not describing unchangeable relative positions. The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Hereinafter, configurations and effects of the present description will be described in detail with reference to the accompanying drawings.

Figure 2:
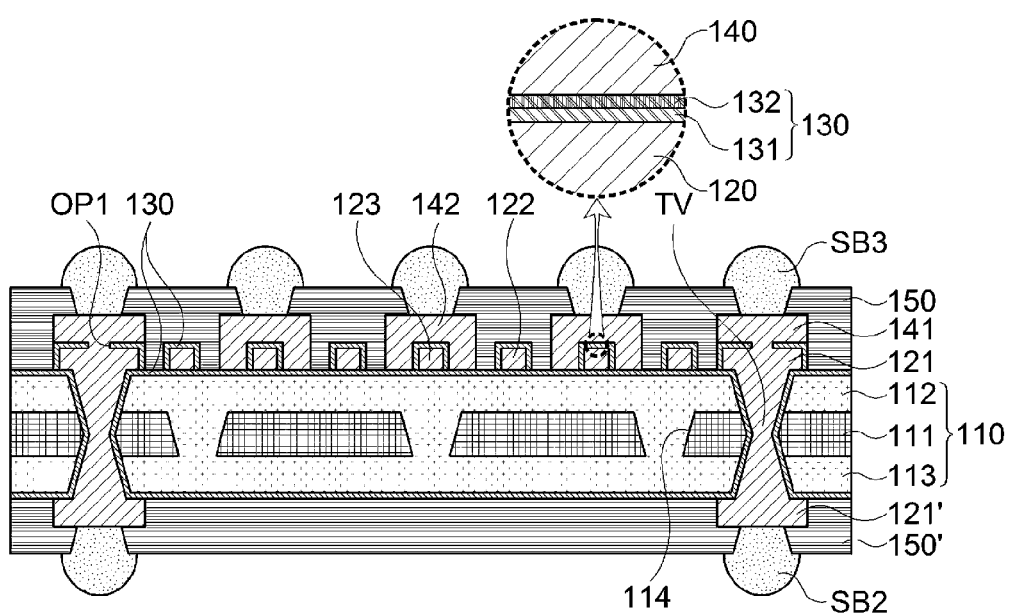
FIG. 2 is a diagram schematically illustrating another example of a circuit board.

FIG. 1 illustrates an example of a circuit board assembly 1000 according to the present description. The circuit board assembly 1000 includes an example of a circuit board 100. FIG. 2 illustrates another example of a circuit board 100-1.

Referring to FIG. 1, in the circuit board 100, an insulation film 130 is disposed on a boundary surface of conductors that need to secure an insulating property, and the insulation film 130 includes an insulating thin film 131 and a function film 132.

In this example, the insulation film 130 is disposed on an outer surface of the first conductive pattern 120, and the second conductive pattern 140 is disposed on an outer surface of the insulation film 130. In addition, the first conductive pattern 120 is disposed on an outer surface of a core part 110. In the case that the core is made of a metallic material, the insulation film 130 may be also disposed on a surface of the core part 110 so the insulating property between the first conductive pattern 120 and the core part may be secured.

The insulating thin film 131 may be made of a material having parylene. For example, the insulating thin film 131 may be formed by placing an intermediate product on which the first conductive pattern is formed in a chamber and performing a vapor deposition using parylene.

In addition, one surface of the function film 132 contacts the insulating thin film 131. The second conductive pattern 140 may be formed on the other side of the function film 132. The function film 132 may enhance a bonding strength or an adhesion strength with the second conductive pattern 140. In one embodiment, the function film 132 may be made of titanium nitride (TiN). The function film 132 may be embodied by sputtering using TiN on the surface of the insulating thin film 131.

By forming the second conductive pattern 140 while the function film 132 is formed on an outer surface of the insulating thin film 131, the second conductive pattern 140 may be fixed stably. The second conductive pattern 140 may be embodied by sputtering using copper (Cu) on the surface of function film 132.

Since the conventional boards are embodied in a way that insulating materials such as synthetic resin are coated on the top of one wiring layer for securing the insulating property and then another wiring layer is formed thereon, there is a limit to the slimness of board. However, since the circuit board 100 according to one embodiment of the present description can secure the insulating property by the insulation film 130 of which thickness is remarkably thinner than the conventional insulation layer that is embodied by coating, it may contribute to the slimness of the circuit board 100. For example, the insulating thin film 131 that is formed by the vapor deposition using parylene can be embodied about five times thinner than the conventional insulation film 130 and still secure the insulating property for electrical paths that convey electrical signals.

In addition, the core part 110 may have more than two layers that are formed of different materials. For example, the core part 110 may have the first core layer 111 and the second core layer 112 disposed on one surface of the first core layer 111, the first core layer 111 and the second core layer 112 may be formed of different materials. Furthermore, the core part 110 may have the first core layer 111 and the second core layer 112 disposed on one surface of the first core layer 111 and the third core layer 113 disposed on the other surface of the first core layer 111. The material that forms the second core layer 112 and the third core layer 113 may be different from material that is used to form the first core layer 111. According to one embodiment, the first core layer 111 may be formed of a metal with relatively strong strength, for example, an invar, and the second core layer 112 and the third core layer 113 may be formed of a metal with relatively weak strength but good handling property, conductivity, and generality, for example, a copper (Cu). According to this embodiment, a warpage may be relieved, and at the same time the heat radiating property may be improved.

By filling a through hole 114 that penetrates the first core layer 111 with the materials of which the second core layer 112 and the third core layer 113 are formed, the second core layer 112 and the third core layer 113 may be connected to each other in an integrated fashion. Accordingly, the bonding strength between the first core layer 111 and the second core layer 112 and between the first core layer 111 and the third core layer 113 can be improved.

As illustrated in FIG. 1, a through via TV that penetrates the core part 110 may be provided as needed. The through via TV may be obtained by forming a through via hole to penetrate through the core part 110. The through via hole may be obtained by various methods such as a mechanical drilling or a laser drilling. In addition, although the through via TV is depicted in a sandglass shape in the examples illustrated in FIGS. 1 and 2, but the shape of the through via TV is not limited thereto. For instance, the shape of the through via TV may be cylindrical with a uniform width in accordance with another example of a circuit board.

The aforementioned insulation film 130 may be disposed on the surface of the core part 110 that is formed of metallic material. While the aforementioned through via hole is formed, the insulation film 130 may be formed on an inner side wall of the through via hole by the vapor deposition using parylene.

While the insulation film 130 is formed, the first conductive pattern 120, the first lower conductive pattern 121', the through via TV or the like may be embodied by any of conventional conductive pattern forming methods such as sputtering, plating, printing or the like.

While the first conductive pattern 120 is formed, the aforementioned step of forming the insulation film 130 is performed again. Accordingly, the insulation film 130 may be formed on the outer surface of the first conductive pattern 120. And then the step of forming the second conductive pattern 140 is performed. Accordingly, the first conductive pattern 120 and the second conductive pattern 140 that secure the insulating property by the insulation film 130 can be embodied.

In addition, a portion of the insulation film 130 that is interposed between the first conductive pattern 121 and the second conductive pattern 141 is opened at OP1 so that the first conductive pattern 121 and the second conductive pattern 141 may be formed in contact with each other directly. That is, the upper conductive pattern and the lower conductive pattern are physically connected to each other so that an electrical connection can be embodied.

Alternatively, the insulation film 130 that is interposed between the first conductive pattern 123 and the second conductive pattern 142 has no opened portion so that the first conductive pattern 123 and the second conductive pattern 142 are isolated from each other. In addition, the second conductive pattern may not be disposed on the outer surface of the insulation film 130 that is formed on an outer surface of the first conductive pattern 122.

Although the second insulation layer 150 that covers the first conductive pattern 120, the second conductive pattern 140, the core part 110 or the like is depicted in FIGS. 1 and 2, additional conductive pattern layers may be further disposed if needed, and the aforementioned insulation film may be interposed between these conductive pattern layers.

In the examples illustrated in FIGS. 1 and 2, the second insulation layer 150 is a solder resist layer, and a portion of the second conductive pattern 140 is exposed to be contacted with the third external connection member SB3.

The conductive pattern that is connected to a lower surface of the through via TV may be referred to as the first lower conductive pattern 121'. In the illustrated examples, the lower conductive pattern 121' contacts the second external connection member SB2.

Referring to the example illustrated in FIG. 1, a recess R1 that is depressed upwardly from the bottom surface of the core part 110 is provided in the circuit board 100. The first electronic component 200 is inserted into the recess R1. Further, in this example, the first electronic component 200 is formed in direct contact with surfaces of the recess R1. The first electronic component 200 may be any active elements such as IC (Integrated Circuit). In another example, the first electronic component 200 may be a passive element. In the event that the first electronic component 200 is an active element, the operation of the first electronic component 200 may generate a lot of heat, and this heat can be rapidly dissipated to other regions through the core part 110. Thus, the overheating of the first electronic component 200 may be relieved.

In this example, an external contact 210 of the first electronic component 200 is formed in contact with the first external connection member SB1.

In this example, the aforementioned first, second and the third external connection member may be embodied as a solder ball. In addition, the first external connection member SB1 and the second external connection member SB2 may be in contact with an additional board 300. The additional board 300 may be a package substrate or a main board.

Alternatively, the third external connection member SB3 may be in contact with the second electronic component 400. The second electronic component 400 may be another substrate or another active or passive element.

In one aspect, the second electronic component 400 may be disposed above the additional board 300 in which the first electronic component 200 is embedded; thus, various signal paths may need to be established between the additional board 300 and the second electronic component 400. The aforementioned circuit board 100 may be applied to meet this need. For example, an electrical signal that is communicated between the first electronic component 200 and the additional board 300 may be transferred to the second electronic component 400 via the circuit board 100. In addition, electrical signals of the additional board 300, which are irrelevant to the first electronic component 200 may be transferred to the second electronic component 400 via the circuit board 100. In other words, the circuit board 100 may perform an exchange of signals between the additional board 300 and the second electronic component 400.

In another aspect, by being formed so as to contact the first electronic component 200 to surfaces of recess R1, the circuit board 100 may effectively dissipate heat that is generated by the first electronic component 200. In addition, as at least a portion of the first electronic component 200 is inserted into the inside of the circuit board 100, the thickness of entire circuit assembly 1000 can be reduced. Also, as the direct connection between the additional board 300 and the second electronic component 400 may be established through the through via TV, the dimension that is required for connection may be reduced and the reliability may be improved, compared to the case that the additional board and the second electronic component are connected to each other by solder ball or top ball with large diameter.

FIG. 2 illustrates another example of a circuit board according to the present description. Compared to the example described with reference to FIG. 1, in the circuit board 100-1, an insulation layer 150' is disposed on a lower surface of the core part 110 with no recess R1 formed thereon.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A circuit board assembly, comprising:
    an additional board comprising a first external connection member and a second external connection member that are exposed through one surface;
    a first electronic component embedded in a circuit board to contact the first external connection member with an external contact; and
    the circuit board disposed on an upper portion of the first electronic component and the additional board, the circuit board being electrically connected to the second external connection member and being in contact with the first electronic component,
    wherein the circuit board comprises:
        a core part having a recess in which at least a portion of the first electronic component is inserted,
        a first lower conductive pattern, one surface of the first lower conductive pattern being in contact with a lower surface of a through via, and other surface of the first lower conductive pattern being connected to the second external connection member,
        a first insulation film, one surface of the first insulation film being in contact with an upper surface of the core part,
        a first conductive pattern, one surface of the first conductive pattern being in contacted with the other surface of the first insulation film,
        a second insulation film, one surface of the second insulation film being in contacted with the other surface of the first conductive pattern, and
        a second conductive pattern, one surface of the second conductive pattern being in contact with the other surface of the second insulation film,
        wherein the second insulation film comprises:
            an insulation thin film contacting the first conductive pattern, and
            a function film disposed on the insulation thin firm and contacting the second conductive pattern.

2. The circuit board assembly of claim 1, wherein the insulation thin film comprises parylene, and the function film comprises titanium nitride (TiN).

3. The circuit board assembly of claim 1, wherein at least a portion of the first conductive pattern is in contact with an upper surface of the through via.

4. The circuit board assembly of claim 1, wherein at least a portion of the second conductive pattern penetrates through the second insulation film to be contacted with the first conductive pattern.

5. The circuit board assembly of claim 1, wherein the circuit board further comprises a third external connection member electrically contacted with the second conductive pattern,
    wherein the circuit board assembly further comprises a second electronic component contacted with the third external connection member.

6. The circuit board assembly of claim 2, wherein the core part comprises a metallic material,
    wherein the first insulation film comprises
    a parylene film, one surface of the parylene film being in contacted with the core part, and
    a titanium nitride film, one surface of the titanium nitride film being in contact with the parylene film, and other surface of the titanium nitride film being in contact with one surface of the first conductive pattern.

7. The circuit board assembly of claim 6, wherein at least one among outer surfaces of the first electronic component directly contacts the metallic material of the core part.

* * * * *